US011244915B2

(12) United States Patent
Chockalingam et al.

(10) Patent No.: US 11,244,915 B2
(45) Date of Patent: Feb. 8, 2022

(54) BOND PADS OF SEMICONDUCTOR DEVICES

(71) Applicant: GLOBALFOUNDRIES Singapore Pte. Ltd., Singapore (SG)

(72) Inventors: Ramasamy Chockalingam, Singapore (SG); Juan Boon Tan, Singapore (SG); Chee Kong Leong, Singapore (SG); Ranjan Rajoo, Singapore (SG); Xuesong Rao, Singapore (SG); Xiaodong Li, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 21 days.

(21) Appl. No.: 16/669,531

(22) Filed: Oct. 31, 2019

(65) Prior Publication Data

US 2021/0134742 A1 May 6, 2021

(51) Int. Cl.
*H01L 23/00* (2006.01)

(52) U.S. Cl.
CPC .............. *H01L 24/05* (2013.01); *H01L 24/03* (2013.01); *H01L 2224/0391* (2013.01); *H01L 2224/03464* (2013.01); *H01L 2224/0401* (2013.01); *H01L 2224/04042* (2013.01); *H01L 2224/0518* (2013.01); *H01L 2224/05076* (2013.01); *H01L 2224/05144* (2013.01); *H01L 2224/05147* (2013.01); *H01L 2224/05155* (2013.01); *H01L 2224/05163* (2013.01); *H01L 2224/05164* (2013.01); *H01L 2924/01004* (2013.01); *H01L 2924/01028* (2013.01); *H01L 2924/01029* (2013.01); *H01L 2924/01042* (2013.01); *H01L 2924/01046* (2013.01); *H01L 2924/35121* (2013.01)

(58) Field of Classification Search
CPC ................................ H01L 24/03; H01L 24/05
See application file for complete search history.

(56) References Cited

U.S. PATENT DOCUMENTS 6,144,096 A * 11/2000 Lopatin ............. H01L 21/76843 257/737
6,538,323 B1 * 3/2003 Sakata .................. H01L 23/481 257/734
8,394,713 B2 3/2013 Mathew
10,283,373 B2 5/2019 Sakashita et al.
2007/0023919 A1 * 2/2007 Lin ......................... H01L 24/11 257/774
2007/0108619 A1 5/2007 Hsu
2007/0173061 A1 * 7/2007 Hong ................ H01L 21/76849 438/687

(Continued)

OTHER PUBLICATIONS

Fenny Liu et al., Halogen-Free Mold Compound Development for Ultra-Thin Packages, Electronic Components and Technology Conference, 2007, 1051-1055, IEEE, New Jersey, US.

*Primary Examiner* — Dale E Page
*Assistant Examiner* — Wilner Jean Baptiste
(74) *Attorney, Agent, or Firm* — Anthony Canale; GlobalFoundries Singapore Pte.

(57) ABSTRACT

A semiconductor device is provided that includes a dielectric layer, a bond pad, a passivation layer and a planar barrier. The bond pad is positioned in the dielectric layer. The passivation layer is positioned over the dielectric layer and has an opening over the bond pad. The planar barrier is positioned on the bond pad.

18 Claims, 9 Drawing Sheets

100
120
124
124
118b
118S
118S
122
118a
114
122
104U
114
102U
106
104E
104
104E
102
122
114S
114U
106
116
114
104
102

(56) References Cited

U.S. PATENT DOCUMENTS

2009/0015285 A1* 1/2009 Farooq .................... H01L 24/05
324/762.03
2018/0218937 A1 8/2018 Van Der Wiel

* cited by examiner

BOND PADS OF SEMICONDUCTOR DEVICES

FIELD OF THE INVENTION

The disclosed subject matter relates generally to semiconductor devices, and more particularly to bond pads of semiconductor devices having improved reliability and methods of forming the same.

BACKGROUND

An integrated circuit (IC) device is made up of a plurality of interconnected semiconductor components. The semiconductor components include, but not limited to, transistors, capacitors and resistors. The IC device will additionally include bond pads for forming interconnections with external packaging components; for example, a printed circuit board connected through wire bonding or flip-chip bonding.

After fabrication of the IC devices is completed, passivation layers are typically arranged over the IC devices to protect the IC devices from environmental contamination. The passivation layers have openings over the bond pads to receive external interconnect structures, such as bonding wires, conductive pillars, or solder bumps, from subsequent assembly processes.

One of the challenges affecting bond pad reliability is ionic contamination arising from the assembly process. The bond pads contaminated with ionic contaminants will result in reduced bond pad reliability, among other things. The ionic contaminants introduced during the assembly process may diffuse along interfaces, e.g., between the bond pad and surrounding dielectric layers, resulting in reduced adhesion and causing detrimental delamination of the bond pad or other effects resulting from exposure to ionic contamination. As a result, the IC devices may exhibit higher failure rate or performance degradation due to effects of the ionic contamination.

Therefore, there is a need to provide bond pads of semiconductor devices having improved reliability and methods of forming the same to overcome, or at least ameliorate, the disadvantage described above.

SUMMARY

To achieve the foregoing and other aspects of the present disclosure, bond pads of semiconductor devices having improved reliability and methods of forming the same are presented.

According to an aspect of the present disclosure, a semiconductor device is provided that includes a dielectric layer, a bond pad, a passivation layer and a planar barrier. The bond pad is positioned in the dielectric layer. The passivation layer is positioned over the dielectric layer and has an opening over the bond pad. The planar barrier is positioned on the bond pad.

According to another aspect of the present disclosure, a semiconductor device is provided that includes a dielectric layer, a bond pad, a passivation layer, a planar barrier and an external interconnect structure. The bond pad is positioned in the dielectric layer. The passivation layer is positioned over the dielectric layer and has an opening over the bond pad. The planar barrier is positioned on the bond pad and the external interconnect structure is positioned over the bond pad.

According to yet another aspect of the present disclosure, a method of forming a semiconductor device is provided that includes providing a dielectric layer and forming a bond pad in the dielectric layer. A passivation layer is formed over the dielectric layer and with an opening over the bond pad. A planar barrier is formed on the bond pad.

BRIEF DESCRIPTION OF THE DRAWINGS

The embodiments of the present disclosure will be better understood from a reading of the following detailed description, taken in conjunction with the accompanying drawings.

Figure 1A:
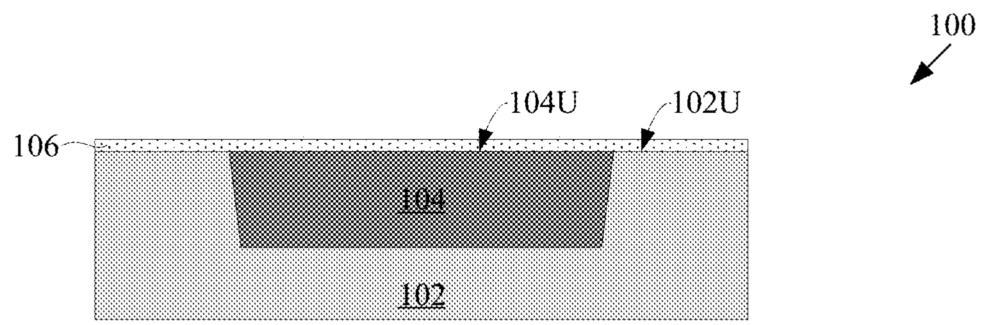
FIGS. 1A-1H are cross-sectional views of a semiconductor device, illustrating a method of improving bond pad reliability, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The present disclosure relates to bond pads having improved reliability and methods of forming the same. Embodiments of the present disclosure are now described in detail with accompanying drawings. It is noted that like and corresponding elements are referred to by like reference numerals.

Methods are disclosed for improving bond pad reliability of a semiconductor device by forming a planar barrier over an upper bond pad surface. The planar barrier may trap ionic contaminants, preventing the ionic contaminants from diffusing along boundaries and thereby improving the bond pad reliability. The term "planar" is broadly defined herein as a flat or level geometric configuration.

The term "bond pad" is broadly defined herein as any terminal structures capable of forming a bond with external interconnect structures, and the bond pad may include both elevated and recessed bond pads as well as flat, concave, or convex bond pads and other terminal structures.

In addition, the present disclosure is not limited to a particular form of interconnect structure that will be received by the bond pad. The interconnect structures may include bonding wires, tape-automated bonding (TAB) structures, conductive pillars, solder bumps, conductive adhesives, or the like. Exemplary embodiments are illustrated as using bonding wires for a wire-bond arrangement and conductive pillars for a flip-chip arrangement, but these embodiments are only some of many examples of the present disclosure which will be apparent to one of skill in the art.

FIGS. 1A-1H are cross-sectional views of a semiconductor device 100, according to embodiments of the present disclosure. FIGS. 1A-1H illustrate a method of improving bond pad reliability of semiconductor devices by providing a planar barrier on an upper bond pad surface. The planar barrier may advantageously reduce the potential occurrence of bond pad delamination induced by ionic contamination. Certain structures may be conventionally fabricated, for example, using known processes and techniques and specifically disclosed processes and methods may be used to achieve individual aspects of the present disclosure.

As illustrated in FIG. 1A, the semiconductor device 100 may include a dielectric layer 102, a bond pad 104, and a capping layer 106. The bond pad 104 may be formed in the dielectric layer 102. The bond pad 104 may have an upper bond pad surface 104U that may be substantially coplanar with an upper dielectric surface 102U. The capping layer 106 may be deposited over the dielectric layer 102 and over the bond pad 104, using a deposition process, such as a chemical vapor deposition (CVD) process or a plasma-enhanced CVD (PECVD) process. Although not shown, the bond pad 104 may be connected to semiconductor components below the dielectric layer 102. Additionally, it is understood that any number of bond pads may be fabricated in the semiconductor device and that only one bond pad has been illustrated for clarity purposes.

The bond pad 104 may be formed of a conductive material, such as aluminum or copper. Copper has more advantages than aluminum; for example, better electromigration performance and lower resistivity. In an embodiment of the disclosure, the bond pad 104 is preferably copper.

The dielectric layer 102 may be a low-k dielectric material, i.e., a dielectric material having a low dielectric constant, to at least contribute to electrically isolate the bond pad 104 from adjacent conductive structures. The dielectric layer 102 may include, but not limited to, silicon dioxide or tetraethyl orthosilicate (TEOS).

The capping layer 106 may be a dielectric material capable of protecting the upper bond pad surface 104U from subsequent processing steps. The capping layer 106 may include, but not limited to, silicon carbonitride or silicon nitride. In an embodiment of the disclosure, the capping layer 106 has a thickness of at least 500 Å.

Figure 1B:
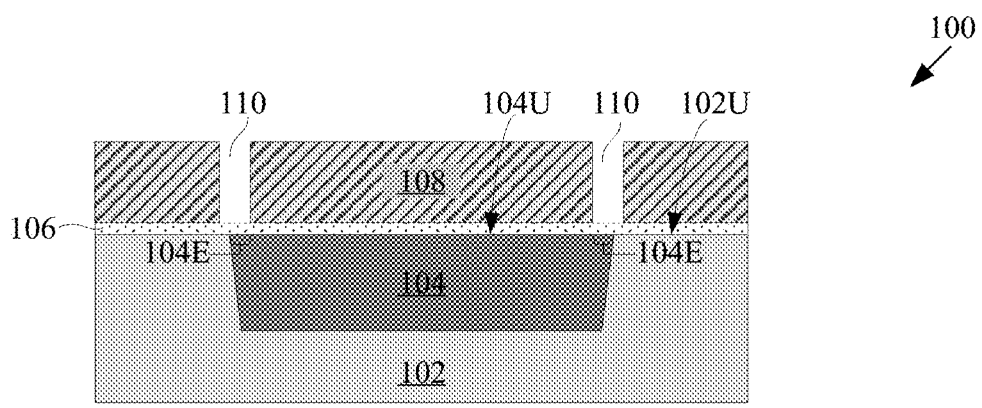

FIG. 1B illustrates the semiconductor device 100 after forming a patterning layer 108 and forming openings 110 in the patterning layer 108, according to an embodiment of the disclosure. The patterning layer 108 may be formed over the capping layer 106 using a deposition process, such as a spin-coating process. The openings 110 may be formed in the patterning layer 108 and the openings 110 may be peripherally surrounding the bond pad 104. The openings 110 may be formed using a lithographic process. The openings 110 may be positioned over bond pad edges 104E and exposes portions of the capping layer 106. In an embodiment of the disclosure, the openings 110 preferably have a width ranging from 0.9 um to 1.1 um.

Figure 1C:
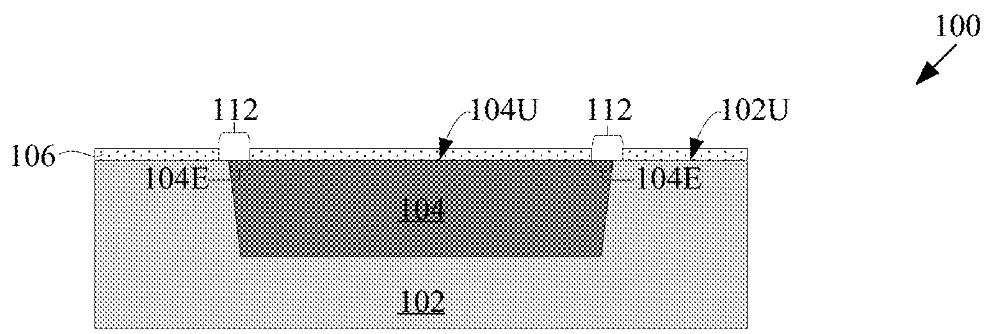

FIG. 1C illustrates the semiconductor device 100 after forming trenches 112 in the capping layer 106, according to an embodiment of the disclosure. The openings (not shown) may be extended through the exposed portions of the capping layer 106, forming the trenches 112 in the capping layer 106. The trenches 112 may be formed using a material removal process, such as a dry etching process. The trenches 112 may be formed peripherally surrounding the bond pad 104 and expose the bond pad edges 104E in the trenches 112. The material removal process may be a process having a substantially high etching selectivity between the capping layer 106 and the bond pad 104 such that the removal of the capping layer 106 does not substantially affect the bond pad 104. The upper bond pad surface 104U is exposed in the trenches 112.

In an embodiment of the disclosure, the trenches 112 may be positioned to additionally expose portions of the upper dielectric surface 102U peripherally surrounding the bond pad edges 104E. The patterning layer (not shown) may be subsequently removed using another material removal process, such as a dry plasma ashing process, a selective wet etching process, or combinations thereof.

Figure 1D:
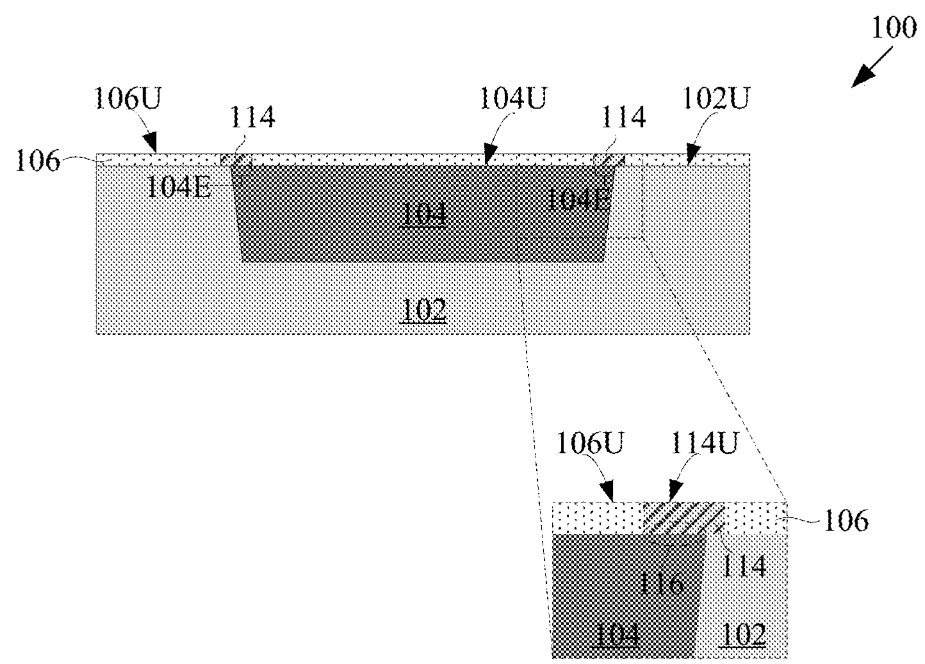

FIG. 1D illustrates the semiconductor device 100 after forming a planar barrier 114 in the trenches 112, according to an embodiment of the disclosure. The planar barrier 114 may be an ion protection barrier and may be formed of a material including metallic elements. The planar barrier 114 may be capable of trapping ionic contaminants potentially introduced during the assembly process, thereby protecting the bond pad 104 from potential delamination or other effects resulting from exposure to ionic contamination. The planar barrier 114 may also be capable of forming substantially strong interfacial bonds with the bond pad 104. In some embodiments of the disclosure, the planar barrier 114 may include palladium, nickel, beryllium, molybdenum, an alloy of nickel, palladium and gold, or combinations thereof.

As used herein, the terms “palladium”, “nickel”, “beryllium”, or “molybdenum” include not only elemental palladium, elemental nickel, elemental beryllium and elemental molybdenum but palladium, nickel, beryllium and molybdenum having other trace elements or in various alloyed combinations with other elements as known in the semiconductor art, as long as the chemical and physical properties of the elements remain substantially unaffected.

The semiconductor device 100 may be subjected to a cleaning process prior to forming the planar barrier 114. The cleaning process may be performed by immersion or spraying the semiconductor device 100 with deionized water, solvents, or combinations thereof to remove particles, residues, contaminants and other undesirable materials from the upper bond pad surface 104U.

The planar barrier 114 may be formed by selectively depositing a barrier material (not shown) in the trenches 112 using a deposition process, such as electroless plating or electroplating. In an embodiment, the deposition process employed may be preferably electroless plating. Electroless plating is a low-cost process and is capable of depositing uniform and thin layers of materials. Electroless plating has known techniques in the art.

The barrier material (not shown) may overfill the trenches 112, and a planarization process may be employed to form the planar barrier 114. The planar barrier 114 may be arranged adjacent to the capping layer 106 and peripherally overlays the bond pad edges 104E. The planar barrier 114 and the capping layer 106 may have substantially equal thicknesses and have substantially coplanar top surfaces (114U and 106U, respectively). The planarization process employed may include a chemical mechanical planarization process. The planar barrier 114 may form an overlap region 116 with the bond pad edges 104E. The overlap region 116 may form substantially strong interfacial bonds between the planar barrier 114 and the bond pad edges 104E at least due to the similarity of the barrier material of the planar barrier 114 and the conductive material of the bond pad 104, both materials including metallic elements.

The ionic contaminants potentially introduced during the assembly process may diffuse along boundaries having weak interfacial bonds, such as a boundary between a dielectric material and a metallic material. In some embodiments of the disclosure, the ionic contaminants may include halides contaminants, such as chlorides, fluorides, bromides, and may also include metallic contaminants, such as sodium ions. The overlap region 116 may protect the integrity of the bond pad 104 by trapping the ionic contaminants in the planar barrier 114, thereby preventing diffusion of those ionic contaminants along the boundaries between the planar barrier 114 and the bond pad 104. The potential occurrence of bond pad delamination induced by ionic contamination may be reduced.

Figure 1E:
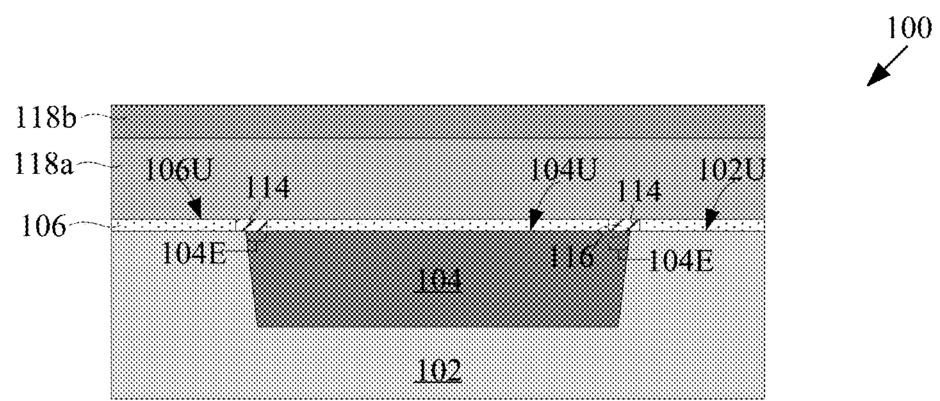

FIG. 1E illustrates the semiconductor device 100 after forming a passivation layer 118, according to an embodiment of the disclosure. The passivation layer 118 may be deposited over the capping layer 106 and the planar barrier 114, using a deposition process, such as a CVD process or a PECVD process. The passivation layer 118 may be a dielectric material capable of protecting the semiconductor device 100 from environmental contamination. The passivation layer 118 may be a one-layer or a multi-layer passivation stack.

In this embodiment of the disclosure, the passivation layer 118 is a multi-layer passivation stack that includes a first layer **118*a* and a second layer 118*b*. The first layer of the passivation layer 118*a* may include TEOS having a thickness of about 7000 Å. The second layer of the passivation layer 118*b*** may include silicon nitride having a thickness of about 3000 Å.

Figure 1F:
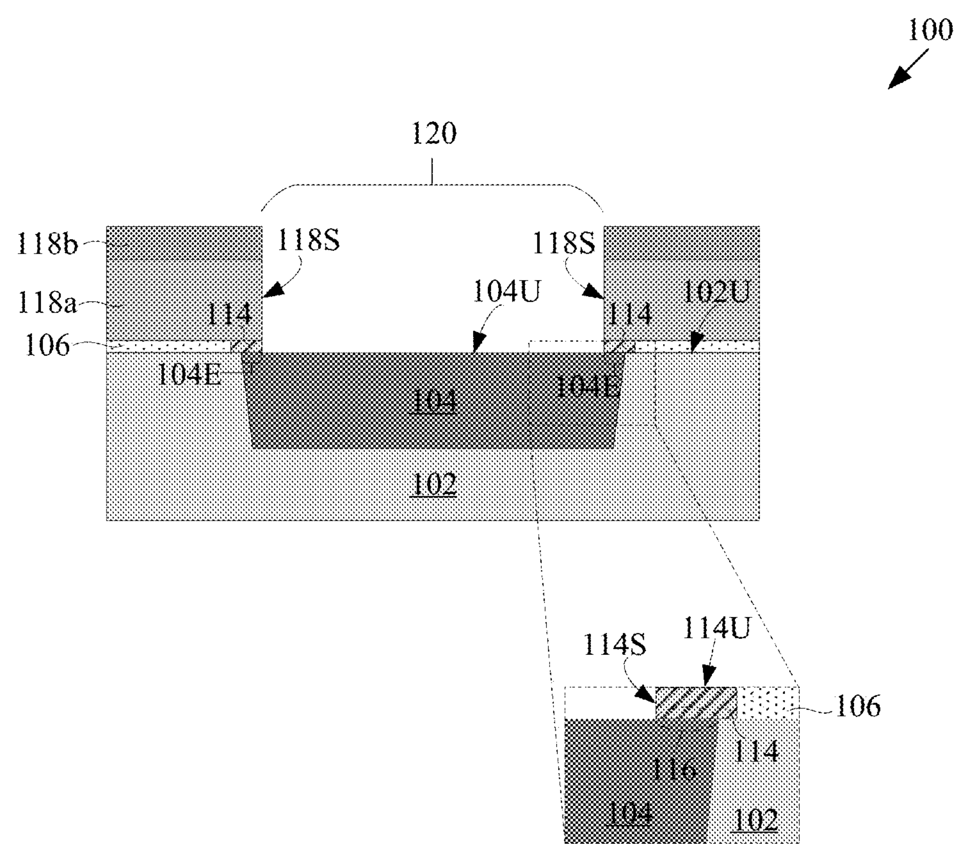

FIG. 1F illustrates the semiconductor device 100 after forming a bond pad opening 120, according to an embodiment of the disclosure. The bond pad opening 120 may be formed by removing portions of the passivation layer 118 and the portions of the capping layer 106 over the bond pad 104, thereby exposing the upper bond pad surface 104U in the bond pad opening 120. The bond pad opening 120 may be formed using a material removal process, such as a dry etching process. The bond pad opening 120 may be defined by end portions of the passivation layer 118S and may have a width at least as wide to expose inner sidewalls of the planar barrier 114S on the bond pad 104.

Figure 1G:
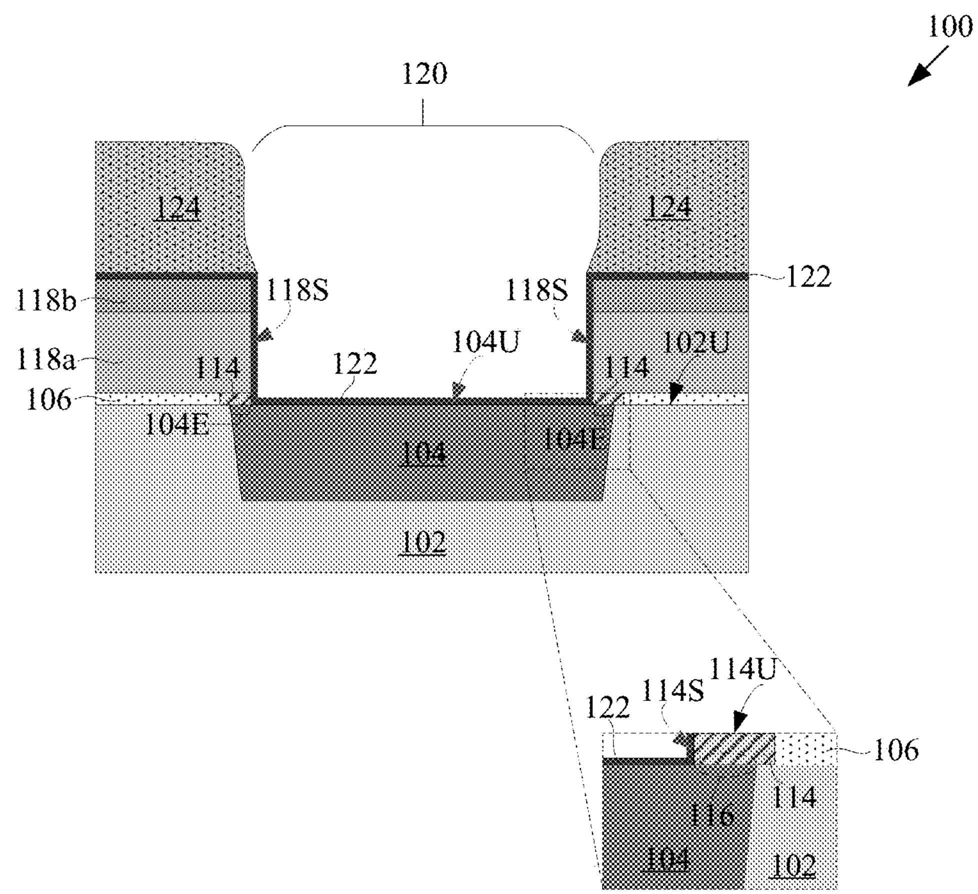

FIG. 1G illustrates the semiconductor device 100 after forming a barrier liner 122 and an insulating layer 124, according to an embodiment of the disclosure. The semiconductor device 100 may be subjected to a suitable cleaning process prior to forming the barrier liner 122. The cleaning process employed may include a plasma cleaning process, a wet cleaning process, a dry cleaning process, or combinations thereof. The cleaning process may remove particles, residues, contaminants, and other undesirable materials from the exposed upper bond pad surface 104U. The presence of contaminants may affect the integrity of a bond formation onto the bond pad.

The barrier liner 122 may be conformally deposited over the passivation layer 118 and over the bond pad 104, covering the end portions of the passivation layer 118S. The barrier liner 122 may be deposited by a deposition process such as, but not limited to, a CVD process, a physical vapor deposition (PVD) process or an atomic layer deposition (ALD) process. The barrier liner 122 may be a material capable of at least impeding the diffusion of ionic contaminants along the boundaries having weak interfacial bonds, e.g., between the first layer of the passivation layer **118*a* and the planar barrier 114. The barrier liner 122 may also have the capability of protecting the bond pad 104 from natural oxidation and environmental contamination. The barrier liner 122 may include, but not limited to, silicon nitride or silicon carbonitride. In an embodiment of the disclosure, the barrier liner 122** is preferably a silicon carbonitride liner.

The insulating layer 124 may be deposited over the barrier liner 122 and in the bond pad opening 120, using a deposition process such as a spin-coating process or a spraying process. A baking process may be employed after the deposition of the insulating layer 124 to remove solvents and strengthen the integrity of the insulating layer 124. The bond pad opening 120 may be formed through the insulating layer 124 by removing a portion of the insulating layer 124 over the bond pad 104. The bond pad opening 120 facilitates a bond formation between the bond pad 104 and an external interconnect structure, e.g., a bonding wire, in the subsequent assembly process. The insulating layer 124 may further undergo a curing process to increase its chemical and thermal stability of the insulating layer 124 after forming the bond pad opening 120. In an embodiment of the disclosure, the insulating layer may be a photosensitive polyimide (PSPI) layer.

Using a PSPI layer, instead of the conventional polyimide (PI) layer, may enable simpler processing steps and may provide greater cost advantage by eliminating a need for a photoresist mask. Patterns may be formed in the PSPI layer using conventional photolithographic processes.

Figure 1H:
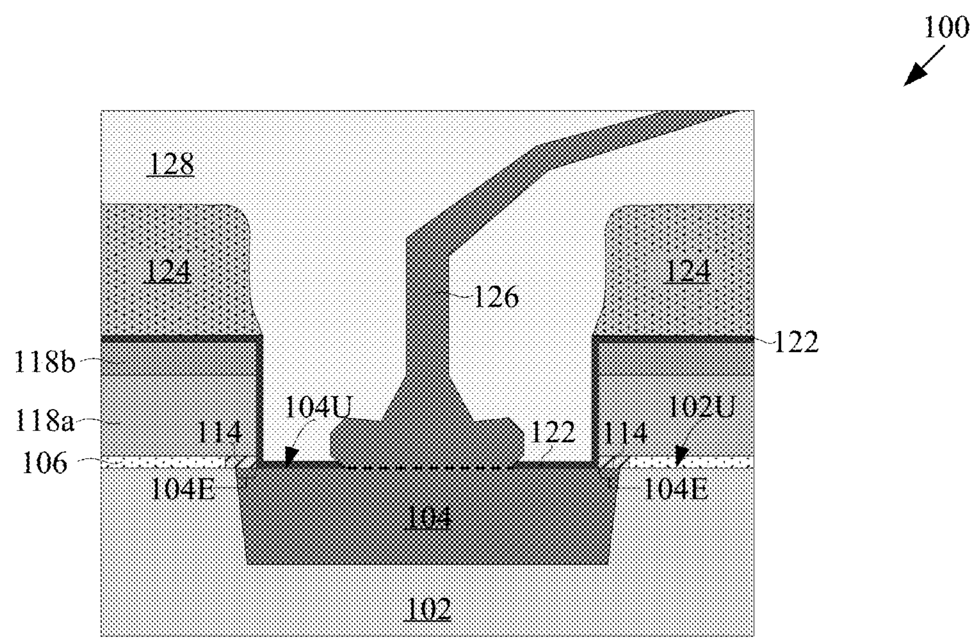

FIG. 1H illustrates the semiconductor device 100 after attaching a bonding wire 126 over the bond pad 104, according to an embodiment of the disclosure. The bonding wire 126 is typically attached during the assembly process. The bonding wire 126 may be mechanically attached on the bond pad 104 through the bond pad opening 120 using a wire bonding process, such as an ultrasonic bonding process. The ultrasonic bonding process is a solid-state process in which the bonding wire 126 to be attached is held at the upper bond pad surface 104U under bias pressure and locally applying thereto a high-frequency vibratory energy. The vibratory energy causes the bonding wire 126 and the bond pad 104 to melt slightly and the bias pressure applied fuses them together, forming a permanent bond.

The portion of the barrier liner 122 over the upper bond pad surface 104U, at which the bonding wire 126 is in direct contact with, may be mechanically broken during the wire bonding process. The remaining portions of the barrier liner 122 over the bond pad 104 remains intact and may serve to protect the bond pad 104 from natural oxidation and environmental contamination. Additionally, the barrier liner 122 covering the end portions of the passivation layer 118S may provide additional mechanical protection during the wire bonding process should any misalignment occurs.

The bonding wire 126 used in a wire bonding process is typically gold or copper. In an embodiment of the disclosure, the bonding wire 126 is preferably copper. Copper wires have a huge cost advantage over gold wires, as well as having superior material properties, such as higher thermal conductivity and higher mechanical strength. Copper wires have the ability to be used at smaller diameters while providing the same performance as gold wires. As the material of the bonding wire 126 and the material of the bond pad 104 may be formed of substantially similar materials, the melting and fusing of the bonding wire 126 and the bond pad 104 during the wire bonding process may be easily achieved to form substantially strong interfacial bonds between the bonding wire 126 and the bond pad 104.

A mold compound 128 may be deposited over the semiconductor device 100 and in the bond pad opening. The mold compound 128 may cover the insulating layer 124, the barrier liner 122 and the bonding wire 126. The mold compound 128 may be a viscous polymeric material. The mold compound 128 may be subjected to a curing process to harden and strengthen the integrity of the mold compound 128. The mold compound 128 may volumetrically shrink after the curing process. The barrier liner 122 may further prevent potential cracks or mechanical damage from propagating into the semiconductor device 100.

FIGS. 2A-2F are cross-sectional views of a semiconductor device 200, according to alternative embodiments of the present disclosure. FIGS. 2A-2E illustrate a method of improving bond pad reliability of semiconductor devices by providing a planar barrier on a bond pad surface. The planar barrier may advantageously reduce the potential occurrence of bond pad delamination induced by ionic contamination.

Figure 2A:
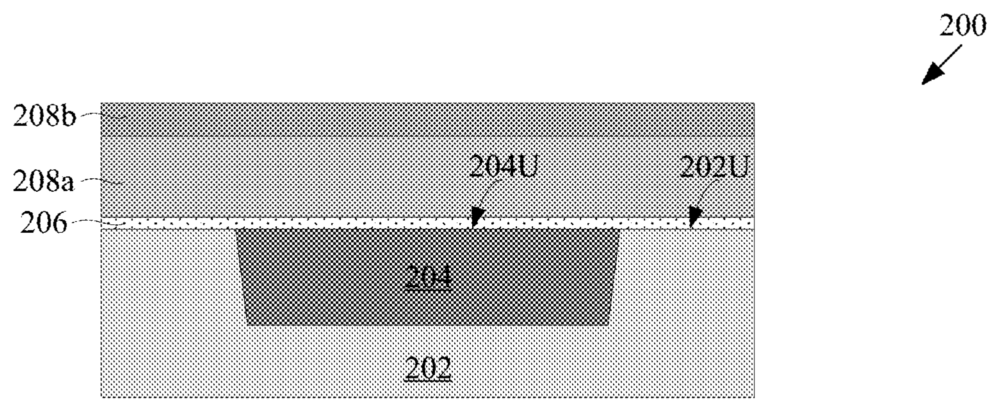
FIGS. 2A-2F are cross-sectional views of a semiconductor device, illustrating another method of improving bond pad reliability, according to alternative embodiments of the disclosure.

As illustrated in FIG. 2A, the semiconductor device 200 may include a dielectric layer 202, a bond pad 204, a capping layer 206 and a passivation layer 208. The bond pad 204 may be formed in the dielectric layer 202 and the bond pad 204 has an upper bond pad surface 204U that may be substantially coplanar with an upper dielectric surface 202U. The capping layer 206 may be deposited over the dielectric layer 202 and over the bond pad 204, using a deposition process such as, but not limited to, a CVD process or a PECVD process. Although not shown, the bond pad 204 may be connected to semiconductor components below the dielectric layer 202. Additionally, it is understood that any number of bond pads may be fabricated in the semiconductor device and that only one bond pad has been illustrated for clarity purposes.

The passivation layer 208 may be deposited over the capping layer 206. Analogous to the passivation layer 118 in the semiconductor device 100, the passivation layer 208 may be a dielectric material capable of protecting the semiconductor device 200 from environmental contamination. The passivation layer 208 may be a one-layer or a multi-layer passivation stack. In this embodiment of the disclosure, the passivation layer 208 is a multi-layer passivation stack that includes a first layer 208*a* and a second layer 208*b*. The first layer of the passivation layer 208*a* may include TEOS having a thickness of about 7000 Å. The second layer of the passivation layer 208*b* may include silicon nitride having a thickness of about 3000 Å.

In an embodiment of the disclosure, the bond pad 204 may be formed of copper. The dielectric layer 202 may be a low-k dielectric material capable of at least contribute to electrically isolate the bond pad 204 from adjacent conductive structures. The capping layer 206 may be a dielectric material being capable of protecting the upper bond pad surface 204U from subsequent processing steps.

Figure 2B:
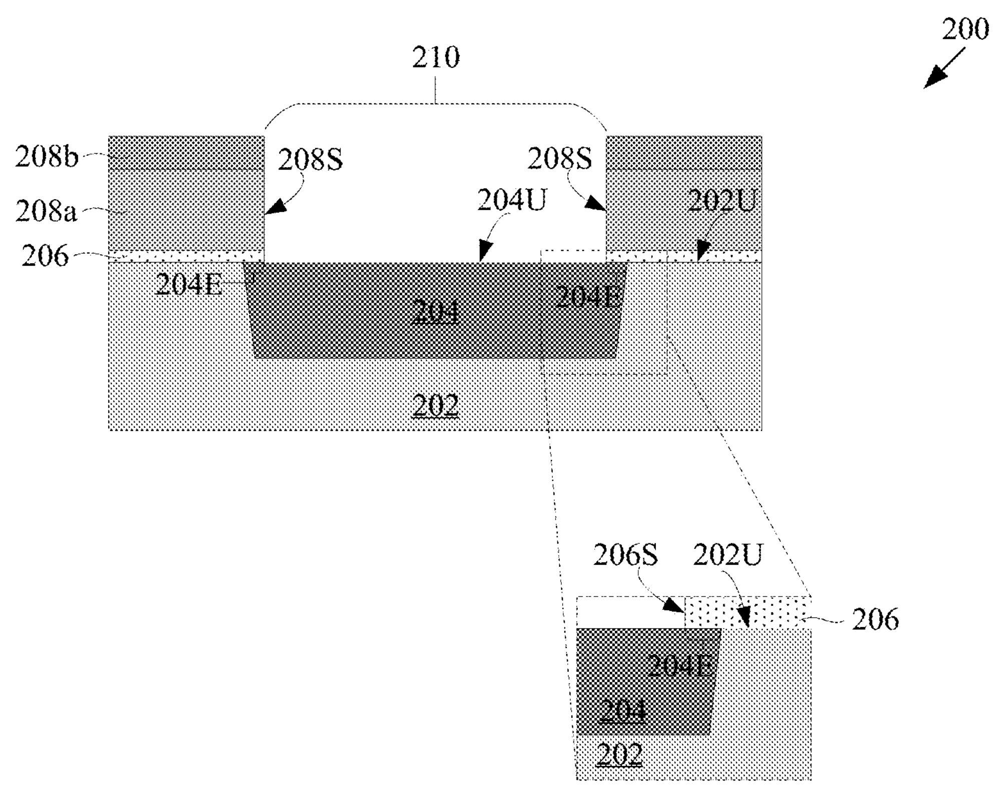

FIG. 2B illustrates the semiconductor device 200 after forming a bond pad opening 210, according to an embodiment of the disclosure. The bond pad opening 210 may be formed by removing portions of the passivation layer 208 and portions of the capping layer 206 over the bond pad 204, thereby exposing the upper bond pad surface 204U in the bond pad opening 210. Bond pad edges 204E may remain covered by the capping layer 206. The bond pad opening 210 may be formed by using a material removal process, such as a dry etching process. The bond pad opening 210 may be defined by end portions of the passivation layer 208S and end portions of the capping layer 206S. The bond pad opening 210 may have a width narrower than a width of the bond pad 204.

Figure 2C:
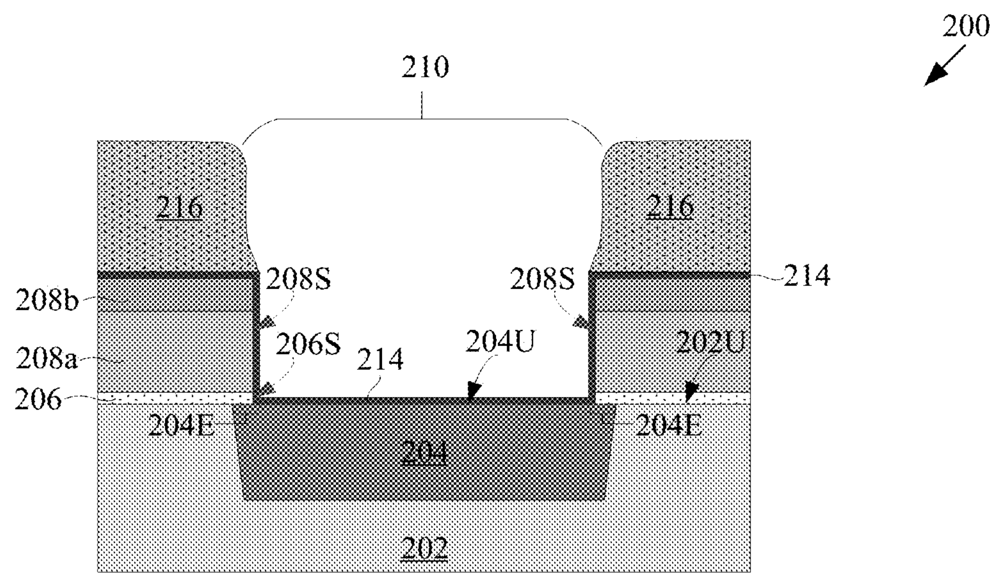

FIG. 2C illustrates the semiconductor device 200 after forming a barrier liner 214 and an insulating layer 216, according to an embodiment of the disclosure. The semiconductor device 200 may be subjected to a suitable cleaning process prior to depositing the barrier liner 214. Analogous to the barrier liner 122 in the semiconductor device 100, the barrier liner 214 may be conformally deposited over the passivation layer 208 and over the bond pad 204, covering the end portions of the passivation layer 208S and the end portions of the capping layer 206S. The barrier liner 214 may include, but not limited to, silicon nitride or silicon carbonitride. In an embodiment of the disclosure, the barrier liner 214 is preferably a silicon carbonitride liner.

The insulating layer 216, analogous to the insulating layer 124 in the semiconductor 100, may be deposited over the barrier liner 214. A baking process may be employed after the deposition of the insulating layer 216 to remove solvents and strengthen the integrity of the insulating layer 216. The bond pad opening 210 may be formed through the insulating layer 216 by removing a portion of the insulating layer 216 over the bond pad 204. A portion of the barrier liner 214 may be exposed in the bond pad opening 210. The bond pad opening 210 facilitates a bond formation between the bond pad 204 and an external interconnect structure, e.g., a bonding wire, in a subsequent assembly process. The insulating layer 216 may further undergo a curing process to increase its chemical and thermal stability. In an embodiment of the disclosure, the insulating layer 216 is preferably a PSPI layer.

Figure 2D:
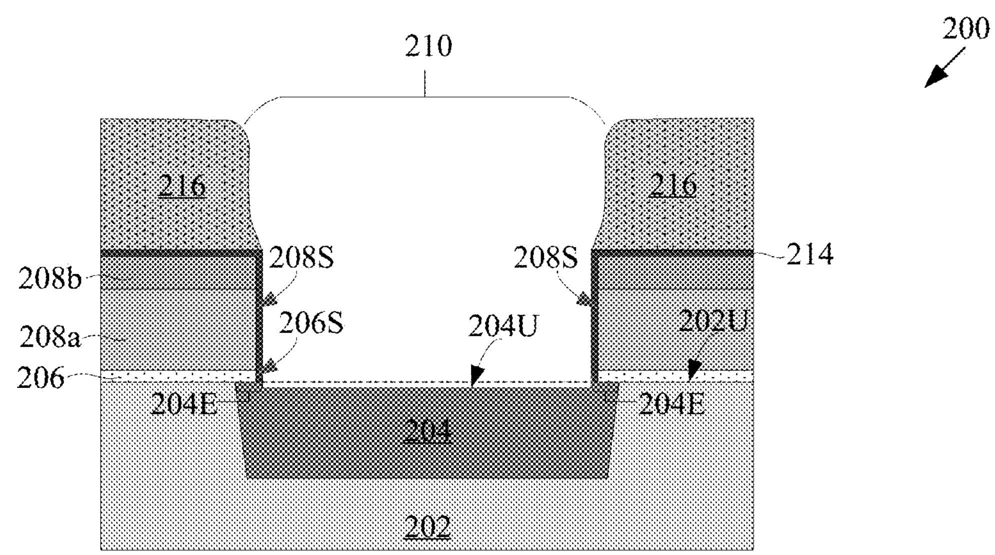

FIG. 2D illustrates the semiconductor device 200 after removing the exposed portion of the barrier liner 214, according to an embodiment of the disclosure. The exposed portion of the barrier liner 214 in the bond pad opening 210 may be removed using a material removal process. A portion of the upper bond pad surface 204U may be exposed in the bond pad opening 210. The material removal process may include an etching process capable of directionally removing materials, such as a RIE process, a sputter etching process, or a vapor phase etching process. In an embodiment of the disclosure, the material removal process employed is preferably a RIE process. The exposed portion of the bond pad 204 may or may not be slightly recessed during the material removal process. In this embodiment of the disclosure, the exposed portion of the bond pad 204 is recessed to a level below the upper dielectric surface 202U and the recessed portion of the bond pad 204 is demarcated by a dotted line.

Figure 2E:
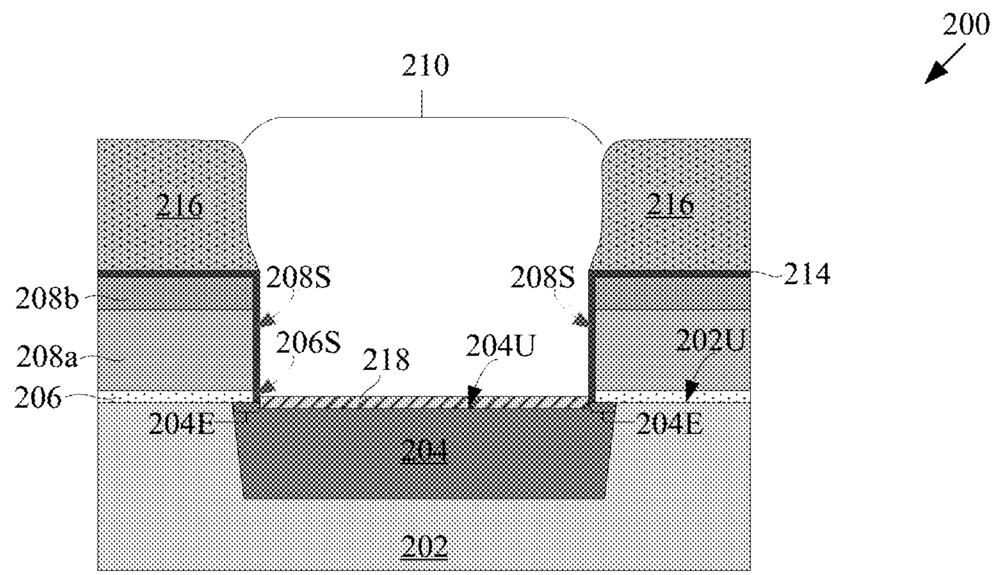

FIG. 2E illustrates the semiconductor device 200 after forming a planar barrier 218 in the bond pad opening 210, according to an embodiment of the disclosure. The planar barrier 218 is analogous to the planar barrier 114 in the semiconductor device 100. The planar barrier 218 may be preferably deposited using electroless plating. Electroless plating has known techniques in the art. The semiconductor device 200 may be subjected to a suitable cleaning process prior to electroless plating the planar barrier 218.

A barrier material (not shown) may be selectively plated over the exposed portion of the bond pad 204 to form the planar barrier 218. The planar barrier 218 may be positioned on the bond pad 204 within the bond pad edges 204E. In an embodiment of the disclosure, the planar barrier 218 has a thickness of at least 500 Å. The planar barrier 218 may be an ion protection barrier and may be formed of a material including metallic elements. The planar barrier 218 may be capable of trapping ionic contaminants potentially introduced during the assembly process, thereby protecting the bond pad 204 from potential delamination or other effects resulting from exposure to ionic contamination. The planar barrier 218 may also be capable of forming substantially strong interfacial bonds with the bond pad 204. In some embodiments of the disclosure, the planar barrier 218 may include palladium, nickel, beryllium, molybdenum, an alloy of nickel, palladium and gold or a combination thereof. In some embodiments of the disclosure, the ionic contaminants may include halides contaminants, such as chlorides, fluorides, or bromides, and may also include metallic contaminants, such as sodium ions.

The planar barrier 218 may overlay a center portion of the upper bond pad surface 204U. The planar barrier 218 may have a width substantially as wide as the bond pad opening 210. The planar barrier 218 and the barrier liner 214 covering the end portions of the passivation layer 208S may protect the bond pad 204 by trapping the ionic contaminants, thereby impeding the diffusion of ionic contaminants along boundaries having weak interfacial bonds. The reliability of the bond pad 204 may be improved as the potential occurrence of bond pad delamination induced by ionic contamination is reduced.

Figure 2F:
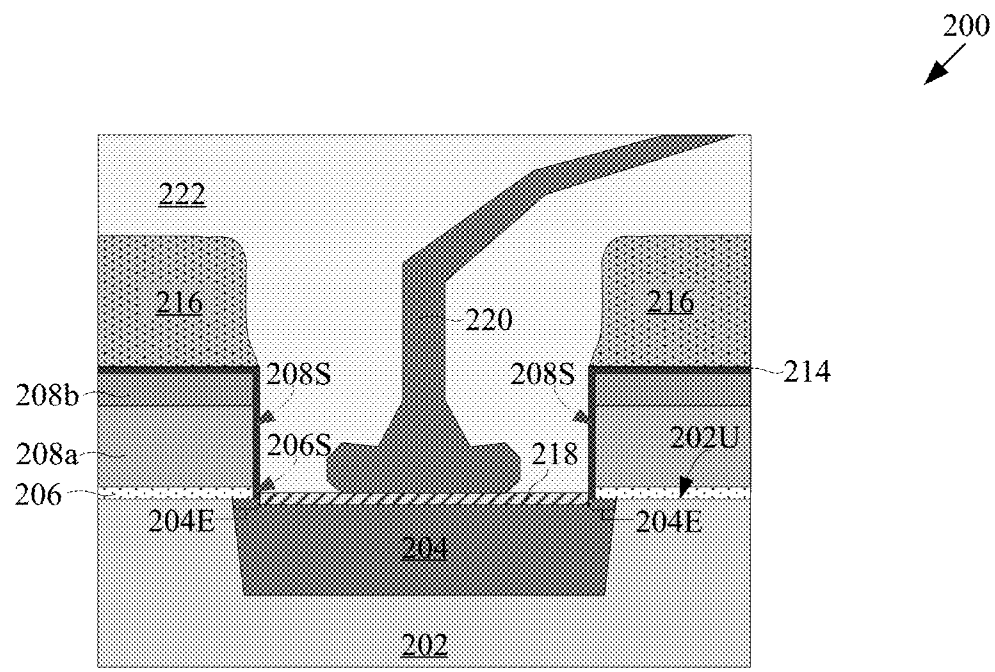

FIG. 2F illustrates the semiconductor device 200 after attaching a bonding wire 220 on the planar barrier 218 and over the bond pad 204, according to an embodiment of the disclosure. The bonding wire 220, analogous to the bonding wire 126 in the semiconductor device 100, may be mechanically attached to the planar barrier 218 through the bond pad opening 210 using a wire bonding process. The barrier liner 214 covering the end portions of the passivation layer 208S may provide additional mechanical protection during the wire bonding process should any misalignment occur.

The bonding wire 220 used in a wire bonding process is typically gold or copper. In this embodiment of the disclosure, the bonding wire 220 is preferably copper. As the bonding wire 220 and the planar barrier 218 are formed of substantially similar materials, i.e., both materials including metallic elements, the melting and fusing of the bonding wire 220 and the planar barrier 218 during the wire bonding process may be easily achieved to form substantially strong interfacial bonds.

A mold compound 222 may be deposited over the semiconductor device 200 and in the bond pad opening 210 (not shown). The mold compound 222 may cover the insulating layer 216, the barrier liner 214, the planar barrier 218 and the bonding wire 220. Analogous to the mold compound 128 in the semiconductor device 100, the mold compound 222 may be a viscous polymeric material. The mold compound 222 may be subjected to a curing process to harden and strengthen the integrity of the mold compound 222. The mold compound 222 may volumetrically shrink after the curing process. The barrier liner 214 may further prevent potential cracks or mechanical damage from propagating into the semiconductor device 200.

Figure 3A:
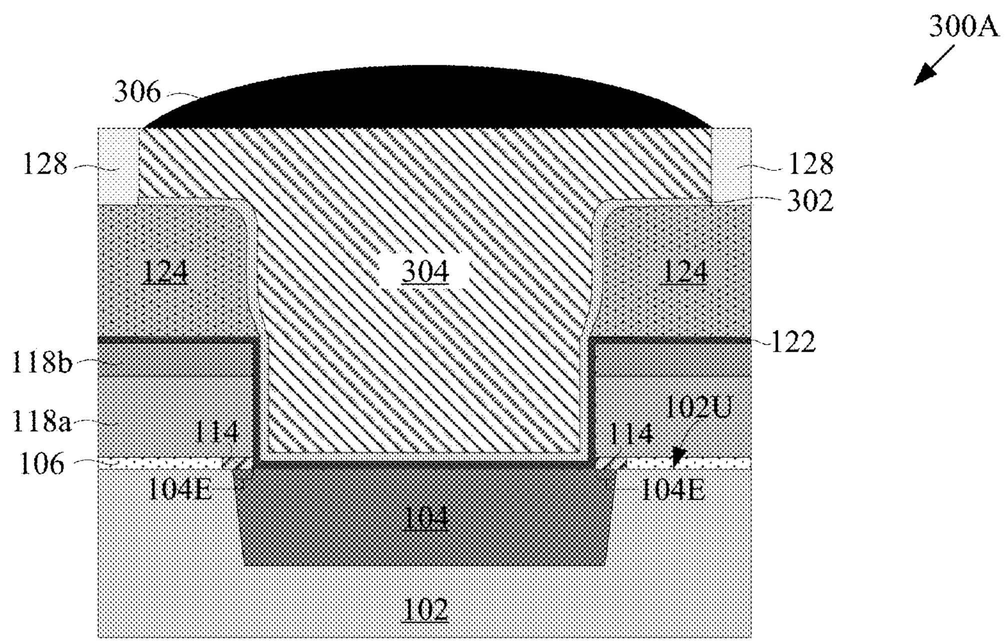
FIGS. 3A-3B are cross-sectional views of semiconductor devices, according to another embodiment of the disclosure.
Figure 3B:
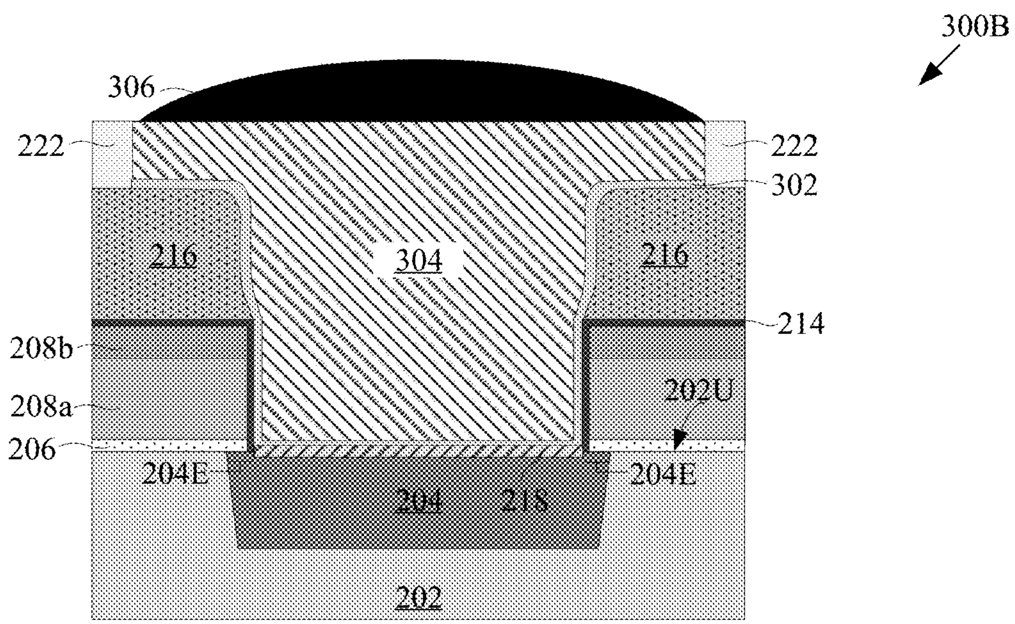

FIGS. 3A-3B are cross-sectional views of semiconductor devices 300A and 300B, respectively, according to an embodiment of the disclosure. The semiconductor device 300A is similar to the semiconductor device 100 in FIG. 1H and the semiconductor device 300B is similar to the semiconductor device 200 in FIG. 2F, except the semiconductor devices 300A and 300B are configured for flip-chip package technology. Features in FIGS. 3A-3B common with features in FIGS. 1H and 2F, respectively, are labeled with the same reference numerals.

Under bump metallization (UBM) layers 302 may be formed over the insulating layers 124 and 216 and over the bond pads 104 and 204 in the bond pad openings (not shown). The UBM layers 302 may function as diffusion barriers to separate the solder bumps (not shown) from the surrounding conductive materials, and also to buffer the temperature between the solder bumps (not shown) and the bond pads 104 and 204 to increase the lifetime of the semiconductor devices 300A and 300B.

A conductive material (not shown) may be deposited over the UBM layers 302 to form conductive pillars 304. In an embodiment of the disclosure, the conductive material is copper and the conductive pillars 304 are copper pillars. Solder caps 306 may be formed over the conductive pillars 304 to provide interconnections with external packaging components. It is understood that FIGS. 3A-3B may be suitably configured for flip-chip package technology using solder bumps.

Figure 4:
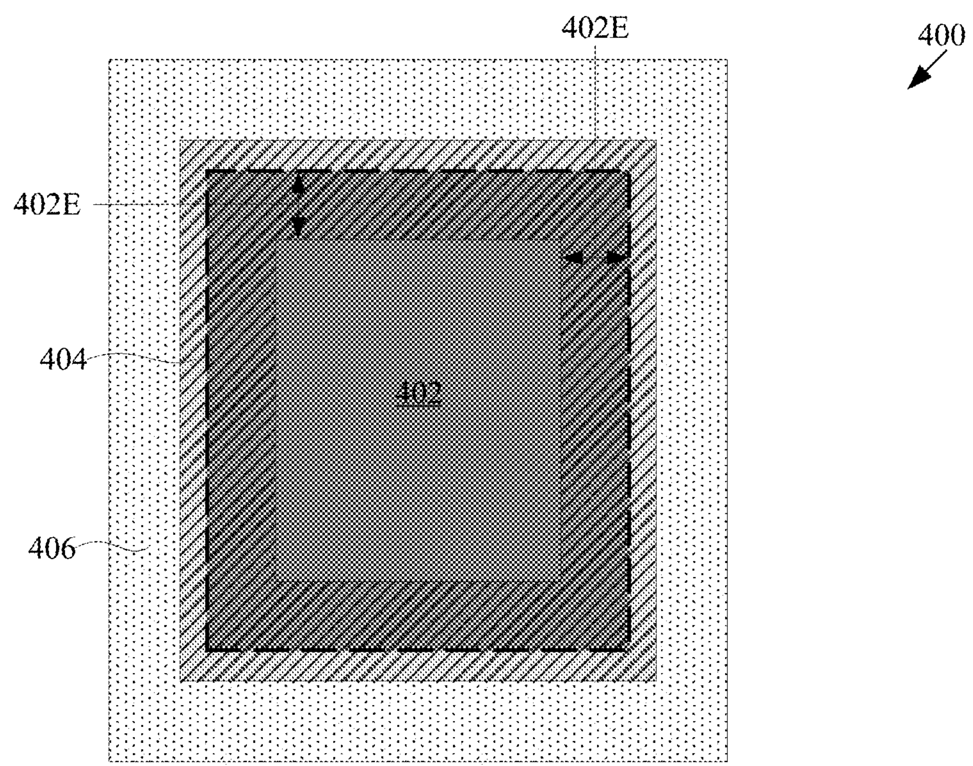
FIG. 4 is a simplified top view of a semiconductor device, according to an embodiment of the disclosure.

FIG. 4 is a simplified top view of a semiconductor device 400, according to an embodiment of the disclosure. The semiconductor device 400 may include a bond pad 402, a planar barrier 404, and a capping layer 406. Although a rectangular bond pad is illustrated in FIG. 4, the bond pad may have various shapes. For example, a bond pad may have a four, a five or other polygonal shapes, including but not limited to, a square, a pentagon or a hexagon.

An outer perimeter of the bond pad 402 is demarcated as a dashed line. The planar barrier 404 may be formed over bond pad edges 402E. The capping layer 406 may be formed adjacent to the planar barrier 404 and the capping layer 406 may be substantially coplanar with the planar barrier 406. An overlap region, correspondingly having a same width as the bond pad edges 402E, may be formed between the bond pad edges 402E and the planar barrier 404. The overlap region peripherally overlays the bond pad edges 402E.

The overlap region may form substantially strong interfacial bonds between the planar barrier 404 and the bond pad edges 402E at least due to a material similarity between the planar barrier 404 and the bond pad 402; both materials including metallic elements. The planar barrier 404 may advantageously reduce a potential occurrence of bond pad delamination possibly induced by ionic contaminants, by trapping the ionic contaminants and preventing the ionic contaminants from diffusing along boundaries. Bond pad reliability may thereby improve.

Figure 5:
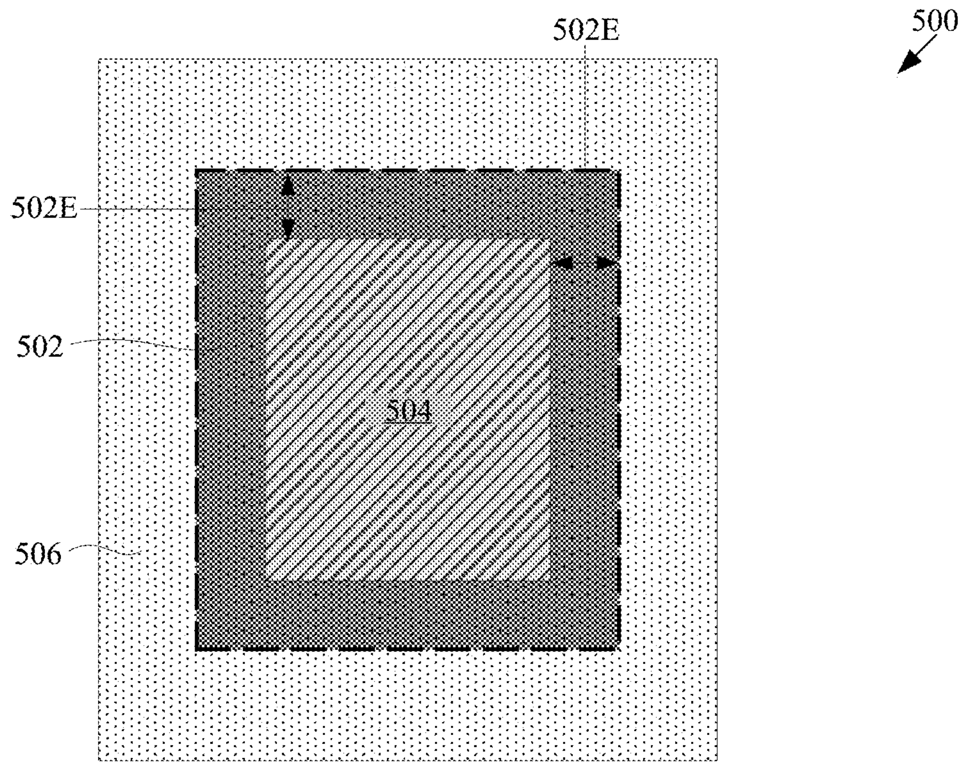
FIG. 5 is a simplified top view of a semiconductor device, according to another embodiment of the disclosure.

FIG. 5 is a simplified top view of a semiconductor device 500, according to another embodiment of the disclosure. The semiconductor device 500 may include a bond pad 502, a planar barrier 504, and a capping layer 506. An outer perimeter of the bond pad 502 is demarcated as a dashed line. The planar barrier 504 may be formed over a center portion of the bond pad 502. The capping layer 506 may be formed over bond pad edges 502E and may be adjacent to the planar barrier 506. The capping layer 506 may be substantially coplanar with the planar barrier 406.

Substantially strong interfacial bonds may be formed between the planar barrier 504 and the bond pad 502 at least due to a material similarity between the planar barrier 504 and the bond pad 502; both materials including metallic elements. The planar barrier 504 may advantageously reduce a potential occurrence of bond pad delamination possibly induced by ionic contaminants, by trapping the ionic contaminants and preventing the ionic contaminants from diffusing along boundaries. Bond pad reliability may thereby improve.

As presented in the above detailed description, methods for improving bond pad reliability of semiconductor devices are presented. A planar barrier may be formed on a bond pad. The planar barrier may be capable of trapping ionic contaminants, preventing the ionic contaminants from diffusing along boundaries. The planar barrier may advantageously reduce a potential occurrence of bond pad delamination possibly induced by ionic contaminants, thereby improving the bond pad reliability.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
- a dielectric layer;
- a bond pad positioned in the dielectric layer, the bond pad having edges in the dielectric layer;
- a passivation layer positioned over the dielectric layer, the passivation layer having a first opening over the bond pad; and
- a planar barrier positioned on the bond pad, wherein the planar barrier peripherally overlays the edges of the bond pad and has a second opening over the bond pad, the second opening having a width at most as wide as the first opening.

2. The semiconductor device of claim 1, wherein the planar barrier has a width ranging from 0.9 um to 1.1 um.

3. The semiconductor device of claim 1, wherein the planar barrier has inner sidewalls on the bond pad and the inner sidewalls define the second opening.

4. The semiconductor device of claim 3, further comprises a barrier liner covering end portions of the passivation layer at the first opening and the inner sidewalls of the planar barrier at the second opening.

5. The semiconductor device of claim 1, further comprises a capping layer positioned adjacent to the planar barrier and between the dielectric layer and the passivation layer.

6. The semiconductor device of claim 5, wherein the capping layer has a first thickness and the planar barrier has a second thickness, and the first thickness is substantially equal to the second thickness.

7. The semiconductor device of claim 1, wherein the planar barrier has a thickness of at least 500 Å.

8. The semiconductor device of claim 1, wherein the planar barrier comprises palladium, nickel, beryllium, molybdenum, or an alloy of nickel, palladium and gold.

9. The semiconductor device of claim 1, wherein the planar barrier has a first portion overlying the edges of the bond pad and a second portion overlying the dielectric layer.

10. The semiconductor device of claim 1, wherein the planar barrier is positioned between the dielectric layer and the passivation layer.

11. A semiconductor device comprising:
- a dielectric layer;
- a bond pad positioned in the dielectric layer, the bond pad having edges in the dielectric layer;
- a passivation layer positioned over the dielectric layer, the passivation layer having a first opening over the bond pad; and
- a planar barrier positioned on the bond pad, wherein the planar barrier peripherally overlays the edges of the bond pad and has a second opening over the bond pad, and the first opening and the second opening defining a bond pad opening.

12. The semiconductor device of claim 11, further comprises a capping layer positioned adjacent to the planar barrier and between the dielectric layer and the passivation layer, wherein the capping layer has an upper surface, and the upper surface is substantially coplanar with the planar barrier.

13. The semiconductor device of claim 11, wherein the bond pad comprises copper.

14. The semiconductor device of claim 11, further comprises an external interconnect structure positioned over the bond pad through the bond pad opening.

15. The semiconductor device of claim 11, wherein the first opening of the passivation layer is substantially coincident with the second opening of the planar barrier.

16. A method of forming a semiconductor device comprising:
- forming a bond pad in a dielectric layer, the bond pad having edges in the dielectric layer;
- forming a passivation layer over the dielectric layer and with a first opening over the bond pad; and
- forming a planar barrier on the bond pad, wherein the planar barrier peripherally overlays the edges of the bond pad and has a second opening over the bond pad, the second opening having a width at most as wide as the first opening.

17. The method of claim 16, wherein the forming of the planar barrier further comprises:
- forming a capping layer over the dielectric layer and the bond pad;

forming trenches in the capping layer positioned at the edges of the bond pad and of the surrounding dielectric layer; and filling the trenches with a barrier material to form the planar barrier.

18. The method of claim 16, further comprises depositing a barrier liner over the passivation layer and covering end portions of the passivation layer at the first opening over the bond pad.

* * * * *